US009013247B2

(12) United States Patent
Takamine

(10) Patent No.: US 9,013,247 B2
(45) Date of Patent: Apr. 21, 2015

(54) ELASTIC WAVE DEMULTIPLEXER

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: Murata Manufacturing Co., Ltd., Ryoto (JP)

( * ) Notice: Subject to any disclaimer, the term of this patent is extended or adjusted under 35 U.S.C. 154(b) by 246 days.

(21) Appl. No.: 13/857,169

(22) Filed: Apr. 5, 2013

(65) Prior Publication Data

US 2013/0214873 A1    Aug. 22, 2013

Related U.S. Application Data

(63) Continuation of application No. PCT/JP2011/064923, filed on Jun. 29, 2011.

(30) Foreign Application Priority Data

Oct. 26, 2010    (JP) .................................. 2010-239787

(51) Int. Cl.
  *H03H 9/72*    (2006.01)
  *H03H 7/42*    (2006.01)
  *H03H 9/05*    (2006.01)
  (Continued)

(52) U.S. Cl.
  CPC ............. *H03H 7/42* (2013.01); *H03H 9/14582* (2013.01); *H03H 9/6433* (2013.01); *H03H 9/0085* (2013.01); *H03H 9/059* (2013.01); *H03H 9/1085* (2013.01); *H03H 9/0576* (2013.01); *H03H 9/725* (2013.01); *H03H 9/0047* (2013.01)

(58) Field of Classification Search
  CPC ..... H03H 7/42; H03H 9/0028; H03H 9/0047; H03H 9/0085; H03H 9/0576; H03H 9/058; H03H 9/059; H03H 9/1085; H03H 9/14582; H03H 9/6433; H03H 9/725
  USPC ......................................... 333/133, 193–196
  See application file for complete search history.

(56) References Cited

U.S. PATENT DOCUMENTS

| 6,750,737 | B2 * | 6/2004 | Uriu et al. ...................... 333/133 |
| 7,180,387 | B2 * | 2/2007 | Hongo et al. ................. 333/132 |

(Continued)

FOREIGN PATENT DOCUMENTS

| JP | 2003-249842 A | 9/2003 |
| JP | 2003-298462   | * 10/2003 |

(Continued)

OTHER PUBLICATIONS

English language machine translation of JP 2003-298462, published Oct. 17, 2003.*

(Continued)

*Primary Examiner* — Barbara Summons
(74) *Attorney, Agent, or Firm* — Keating & Bennett, LLP

(57) ABSTRACT

In an elastic wave demultiplexer having excellent isolation characteristics, a first ground wiring electrode is connected to a second ground wiring electrode, via first ground via-hole electrodes. The first ground wiring electrode is connected to ground land electrodes via second ground via-hole electrodes. The second ground wiring electrode is connected to a ground terminal via third ground via-hole electrodes. The number of the first ground via-hole electrodes is greater than the number of the second ground via-hole electrodes and the number of the third ground via-hole electrodes.

16 Claims, 11 Drawing Sheets

(51) Int. Cl.
H03H 9/145 (2006.01)
H03H 9/64 (2006.01)
H03H 9/00 (2006.01)
H03H 9/10 (2006.01)

(56) References Cited

U.S. PATENT DOCUMENTS

| | | | |
|---|---|---|---|
| 7,196,594 B2* | 3/2007 | Cheema et al. | 333/133 |
| 2003/0085774 A1 | 5/2003 | Uriu et al. | |
| 2003/0146677 A1* | 8/2003 | Baba et al. | 310/348 |
| 2004/0155730 A1 | 8/2004 | Iwamoto et al. | |
| 2008/0284540 A1 | 11/2008 | Nishihara et al. | |
| 2010/0066461 A1 | 3/2010 | Yonekura | |
| 2010/0127799 A1 | 5/2010 | Bauer et al. | |
| 2011/0109400 A1* | 5/2011 | Koga et al. | 333/4 |

FOREIGN PATENT DOCUMENTS

| | | |
|---|---|---|
| JP | 2006-066978 A | 3/2006 |
| JP | 2008-118192 A | 5/2008 |
| JP | 2009-500928 A | 1/2009 |
| WO | 2008/146525 A1 | 12/2008 |
| WO | WO 2009/028683 * | 3/2009 |

OTHER PUBLICATIONS

Official Communication issued in International Patent Application No. PCT/JP2011/064923, mailed on Aug. 23, 2011.

Official Communication issued in corresponding German Patent Application No. 11 2011 103 586.1 mailed on Feb. 26, 2014.

* cited by examiner

ELASTIC WAVE DEMULTIPLEXER

BACKGROUND OF THE INVENTION

1. Field of the Invention

The present invention relates to elastic wave demultiplexers, and more particularly, to a Chip Size Package (CSP) elastic wave demultiplexer including a longitudinally-coupled-resonator-type elastic wave filter portion.

2. Description of the Related Art

For example, communication devices, such as mobile phones, supporting Code Division Multiple Access (CDMA) including Universal Mobile Telecommunications System (UMTS), include duplexers installed in their radio-frequency (RF) circuits in order to simultaneously perform transmission and reception of signals. Such a duplexer is a demultiplexer including a transmission filter, a reception filter, and a matching circuit. The duplexer is required to have a small insertion loss within the pass band and a large attenuation near the pass band in each of the transmission filter and the reception filter.

Surface acoustic wave duplexers in which their transmission filters and reception filters are defined by surface acoustic wave filters have been put into practical use. The reception filters in the duplexers have been required to have a balun function in recent years in order to omit separate baluns in RF circuits in mobile phones. Accordingly, surface acoustic wave duplexers in which the reception filters are defined by balanced longitudinally-coupled-resonator-type surface acoustic wave filters having a balanced-to-unbalanced conversion function are installed in the RF circuits in mobile phones (see, for example, Japanese Unexamined Patent Application Publication No. 2003-249842).

Reduction in size of demultiplexers, such as duplexers, is required in communication devices including mobile phones in order to reduce the sizes of their RF circuits. CSP elastic wave demultiplexers are known as the compact demultiplexers. In the CSP elastic wave demultiplexers, elastic wave filter chips are flip-flop mounted on wiring substrates and the elastic wave filter chips are sealed with sealing resin.

In the CSP elastic wave demultiplexers, inductors used in the transmission filters and the reception filters, inductors and delay lines defining matching circuits, and other circuit elements can be formed on the wiring substrates in order to improve the filter characteristics of the transmission filter and the reception filters. In other words, the inductors and the delay lines can be made of wirings provided on the surface of the wiring substrates or provided in the wiring substrates.

However, when the inductors and the delay lines are provided on or in the wiring substrates, for example, electrical coupling can occur in the wiring substrates and/or the transmission filters and the reception filters can be poorly grounded. If the transmission filters and the reception filters are poorly grounded, signals outside the pass bands that should flow into the ground may not flow into the ground. As a result, the attenuations outside the pass bands in the transmission filters and the reception filters are degraded, thereby degrading the isolation characteristics of the elastic wave demultiplexers.

In particular, the attenuations outside the pass bands are more likely to be degraded in the longitudinally-coupled-resonator-type surface acoustic wave filters when the grounding is poor, as compared to ladder-type surface acoustic wave filters. Accordingly, the isolation is likely to be degraded especially in surface acoustic wave filters that include a longitudinally-coupled-resonator-type surface acoustic wave filter as their reception filters.

SUMMARY OF THE INVENTION

Preferred embodiments of the present invention provide an elastic wave demultiplexer having excellent isolation characteristics.

A preferred embodiment of the present invention provides an elastic wave demultiplexer including an elastic wave filter chip and a wiring substrate. The elastic wave filter chip includes a longitudinally-coupled-resonator-type elastic wave filter unit. The longitudinally-coupled-resonator-type elastic wave filter unit includes a piezoelectric substrate and a plurality of IDT electrodes. The plurality of IDT electrodes are provided on the piezoelectric substrate. The wiring substrate includes a die-attach surface and a rear surface. The elastic wave filter chip is mounted on the die-attach surface. The wiring substrate includes a land electrode layer including a plurality of land electrodes, a rear-surface terminal layer including a plurality of terminals, a plurality of intermediate electrode layers including a plurality of wiring electrodes, and at least three dielectric layers. The plurality of land electrodes are provided on the die-attach surface. The plurality of land electrodes are connected to the elastic wave filter chip. The plurality of terminals are provided on the rear surface. The plurality of land electrodes are connected to the plurality of terminals via the plurality of wiring electrodes. The dielectric layers are arranged between two of the land electrode layer, the plurality of intermediate layers, and the rear-surface terminal layer. The dielectric layers include a plurality of via-hole electrodes connecting to any of the plurality of land electrodes, the plurality of wiring electrodes, and the plurality of terminals. The plurality of terminals include a ground terminal that is grounded. The plurality of land electrodes include ground land electrodes connected to the ground terminal. The plurality of wiring electrodes include a plurality of ground wiring electrodes via which the ground terminal is connected to the ground land electrodes. The plurality of via-hole electrodes include first ground via-hole electrodes, second ground via-hole electrodes, and a third ground via-hole electrode. The ground wiring electrodes are connected to each other via the first ground via-hole electrodes. The ground wiring electrodes are connected to the ground land electrodes via the second ground via-hole electrodes. The ground wiring electrodes are connected to the ground terminal via the third ground via-hole electrode. The number of first ground via-hole electrodes is preferably greater than the numbers of the second and third ground via-hole electrodes.

According to a preferred embodiment of the present invention, the elastic wave demultiplexer includes a transmission filter and a reception filter. The reception filter is defined by the longitudinally-coupled-resonator-type elastic wave filter unit.

According to another preferred embodiment of the present invention, the longitudinally-coupled-resonator-type elastic wave filter unit is preferably a balanced longitudinally-coupled-resonator-type elastic wave filter unit having a balanced-to-unbalanced conversion function.

According to another preferred embodiment of the present invention, the dielectric layers are preferably made of resin. The "resin" includes resin containing a filler or a fibrous member. For example, glass epoxy resin may be included in the resin.

According to a preferred embodiment of the present invention, the number of the first ground via-hole electrodes is preferably greater than the number of the second and third ground via-hole electrodes. Accordingly, the isolation characteristics of the elastic wave demultiplexer are improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described herein, taking a duplexer 1 shown in FIG. 1 and FIG. 2 as a non-limiting example. The duplexer 1 is a surface acoustic wave demultiplexer. However, the duplexer 1 is only an example. The elastic wave demultiplexer according to the present invention is not limited to the duplexer 1. The elastic wave demultiplexer according to preferred embodiments of the present invention may be a demultiplexer, such as a triplexer, instead of the duplexer. Alternatively, the elastic wave demultiplexer according to preferred embodiments of the present invention may be a boundary acoustic wave demultiplexer that utilizes boundary acoustic waves.

The duplexer 1 of the present preferred embodiment may preferably be installed in an RF circuit of, for example, a mobile phone preferably supporting the CDMA including the UMTS. Specifically, the duplexer 1 preferably supports UMTS Band 2, for example. The transmission frequency band of the UMTS Band 2 is within a range of 1,850 MHz to 1,910 MHz and the reception frequency band thereof is within a range of 1,930 MHz to 1,990 MHz, for example.

Figure 1:
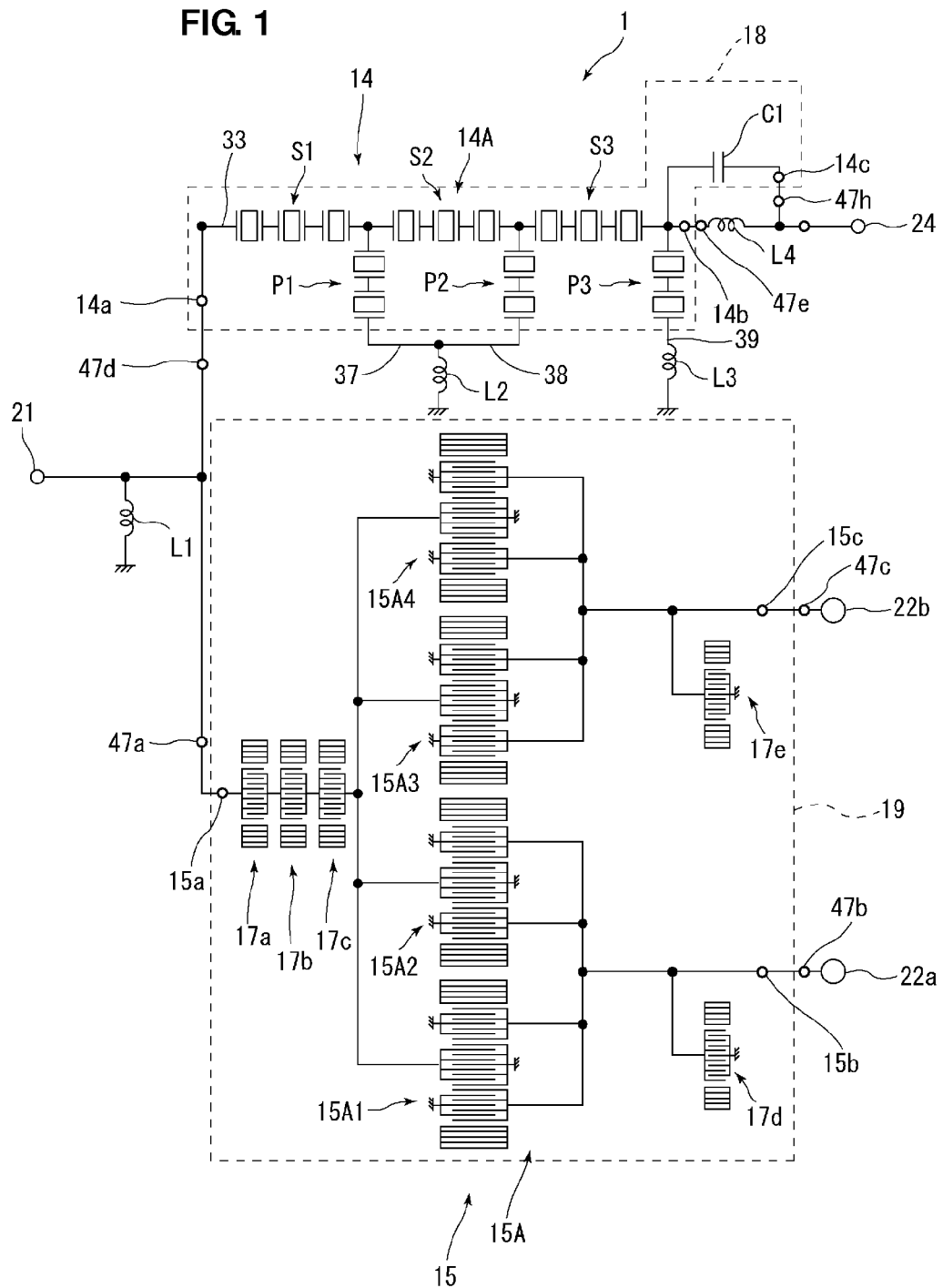
FIG. 1 is a schematic circuit diagram of a duplexer according to a preferred embodiment of the present invention.

FIG. 1 is a schematic circuit diagram of the duplexer 1 according to the present preferred embodiment. The circuit configuration of the duplexer 1 will now be described with reference to FIG. 1.

Referring to FIG. 1, the duplexer 1 includes an antenna terminal 21 connected to an antenna, a transmission terminal 24, and first and second reception terminals 22a and 22b. A transmission filter 14 is connected between the antenna terminal 21 and the transmission terminal 24. A reception filter 15 is connected between the antenna terminal 21 and the first and second reception terminals 22a and 22b. A matching circuit including an inductor L1 is connected between the connection point between the connection point between the transmission filter 14 and the reception filter 15 and the antenna terminal 21 and the ground.

The transmission filter 14 includes an output terminal 14a, an input terminal 14b, and a ladder-type surface acoustic wave filter unit 14A. The output terminal 14a is connected to the antenna terminal 21. The input terminal 14b is connected to the transmission terminal 24. The ladder-type surface acoustic wave filter unit 14A is connected between the output terminal 14a and the input terminal 14b. The ladder-type surface acoustic wave filter unit 14A includes a series arm 33 via which the output terminal 14a is connected to the input terminal 14b. In the series arm 33, series arm resonators S1, S2, and S3 are connected in series to each other. Each of the series arm resonators S1, S2, and S3 preferably includes a plurality of surface acoustic wave resonators that function as one resonator. The series arm resonators S1, S2, and S3 each including the plurality of surface acoustic wave resonators allow the electric power handling capability of the transmission filter 14 to be improved. However, each of the series arm resonators S1, S2, and S3 may include only one surface acoustic wave resonator.

The ladder-type surface acoustic wave filter unit 14A includes parallel arms 37 to 39 connected between the series arm and the ground. The parallel arms 37, 38, and 39 include parallel arm resonators P1, P2, and P3, respectively. Each of the parallel arm resonators P1, P2, and P3 preferably includes a plurality of surface acoustic wave resonators that function as one resonator. The parallel arm resonators P1, P2, and P3 each including the plurality of surface acoustic wave resonators allow the electric power handling capability of the transmission filter 14 to be improved. However, each of the parallel arm resonators P1, P2, and P3 may include only one surface acoustic wave resonator, for example.

An inductor L2 is connected between the parallel arm resonators P1 and P2 and the ground. An inductor L3 is connected between the parallel arm resonator P3 and the ground.

The transmission filter 14 includes an LC resonant circuit including a capacitor C1 and an inductor L4. The capacitor C1 and the inductor L4 are connected in series between the input terminal 14b and the transmission terminal 24. The capacitor C1 is connected in parallel to the inductor L4. The LC resonant circuit provides an attenuation pole at the higher frequency side of the pass band of the transmission filter 14. The presence of the capacitor C1 and the inductor L4 enables impedance matching in the transmission terminal 24 to be achieved.

The surface acoustic wave resonator including each of the series arm resonators S1 to S3 and the parallel arm resonators P1 to P3 includes one interdigital transducer (IDT) electrode and a pair of reflectors arranged on both sides of the propagation direction of the surface acoustic wave of the IDT electrode. In other words, the surface acoustic wave resonator including each of the series arm resonators S1 to S3 and the parallel arm resonators P1 to P3 is a one-port surface acoustic wave resonator. The capacitor C1 includes a pair of interdigital electrodes engaged with each other.

The reception filter 15 includes an unbalanced signal terminal 15a and first and second balanced signal terminals 15b and 15c. The unbalanced signal terminal 15a is connected to the antenna terminal 21. The first balanced signal terminal 15b is connected to the first reception terminal 22a. The second balanced signal terminal 15c is connected to the second reception terminal 22b. The reception filter 15 includes a longitudinally-coupled-resonator-type surface acoustic wave filter unit 15A connected between the unbalanced signal terminal 15a and the first and second balanced signal terminals 15b and 15c. The longitudinally-coupled-resonator-type surface acoustic wave filter unit 15A is a balanced longitudinally-coupled-resonator-type surface acoustic wave filter unit having the balanced-to-unbalanced conversion function. In the present preferred embodiment, the impedance of the unbalanced signal terminal 15a is preferably equal or substantially equal to about 50Ω and the impedance of the first and second balanced signal terminals 15b and 15c is preferably equal or substantially equal to about 100Ω, for example.

The longitudinally-coupled-resonator-type surface acoustic wave filter unit 15A includes a first longitudinally-coupled-resonator-type surface acoustic wave filter portion 15A1, a second longitudinally-coupled-resonator-type surface acoustic wave filter portion 15A2, a third longitudinally-coupled-resonator-type surface acoustic wave filter portion 15A3, a fourth longitudinally-coupled-resonator-type surface acoustic wave filter portion 15A4, and surface acoustic wave resonators 17a to 17e.

The first and second longitudinally-coupled-resonator-type surface acoustic wave filter portions 15A1 and 15A2 are connected between the unbalanced signal terminal 15a and the first balanced signal terminal 15b. In contrast, the third and fourth longitudinally-coupled-resonator-type surface acoustic wave filter portions 15A3 and 15A4 are connected between the unbalanced signal terminal 15a and the second balanced signal terminal 15c.

Each of the first to fourth longitudinally-coupled-resonator-type surface acoustic wave filter portions 15A1 to 15A4 preferably includes three IDT electrodes arranged along the propagation direction of the surface acoustic wave and a pair of reflectors arranged on both sides of the propagation direction of the surface acoustic wave in the area in which the three IDT electrodes are provided. In other words, each of the first to fourth longitudinally-coupled-resonator-type surface acoustic wave filter portions 15A1 to 15A4 is a three-IDT longitudinally-coupled-resonator-type surface acoustic wave filter portion.

In the first to fourth longitudinally-coupled-resonator-type surface acoustic wave filter portions 15A1 to 15A4, the IDT electrodes positioned on both sides of the propagation direction of the surface acoustic wave of the third and fourth longitudinally-coupled-resonator-type surface acoustic wave filter portions 15A3 and 15A4 are inverted with respect to the IDT electrodes positioned on both sides of the propagation direction of the surface acoustic wave of the first and second longitudinally-coupled-resonator-type surface acoustic wave filter portions 15A1 and 15A2 for phase inversion. The remaining configuration of the first and second longitudinally-coupled-resonator-type surface acoustic wave filter portions 15A1 and 15A2 is the same or substantially the same as that of the third and fourth longitudinally-coupled-resonator-type surface acoustic wave filter portions 15A3 and 15A4.

The surface acoustic wave resonators 17a to 17c are connected in series between the unbalanced signal terminal 15a and the first to fourth longitudinally-coupled-resonator-type surface acoustic wave filter portions 15A1 to 15A4. Each of the surface acoustic wave resonators 17a to 17c includes one IDT electrode and a pair of reflectors arranged on both sides of the propagation direction of the surface acoustic wave of the IDT electrode. In other words, each of the surface acoustic wave resonators 17a to 17c is a one-port surface acoustic wave resonator.

The surface acoustic wave resonators 17a to 17c are provided to adjust the phase with the transmission filter 14. Accordingly, the surface acoustic wave resonators 17a to 17c are configured so that their resonant frequencies are positioned within the pass band of the reception filter 15 and their anti-resonant frequencies are positioned at the higher-frequency side of the pass band of the reception filter 15 and outside the pass band thereof.

The surface acoustic wave resonator 17d is connected between the connection point between the first and second longitudinally-coupled-resonator-type surface acoustic wave filter portions 15A1 and 15A2 and the first balanced signal terminal 15b and the ground. In contrast, the surface acoustic wave resonator 17e is connected between the connection point between the third and fourth longitudinally-coupled-resonator-type surface acoustic wave filter portions 15A3 and 15A4 and the second balanced signal terminal 15c and the ground.

Each of the surface acoustic wave resonators 17d and 17e includes one IDT electrode and a pair of reflectors arranged on both sides of the propagation direction of the surface acoustic wave of the IDT electrode. In other words, each of the surface acoustic wave resonators 17d and 17e is a one-port surface acoustic wave resonator. The surface acoustic wave resonators 17d and 17e are provided to increase the out-of-band attenuation of the reception filter 15. Accordingly, the surface acoustic wave resonators 17d and 17e are configured so that their resonant frequencies are positioned at the lower-frequency side of the pass band of the reception filter 15 and outside the pass band thereof and their anti-resonant frequencies are positioned within the pass band of the reception filter 15.

In the first to fourth longitudinally-coupled-resonator-type surface acoustic wave filter portions 15A1 to 15A4 in the present preferred embodiment, narrow-pitch electrode fingers are provided at ends of the IDT electrodes in portions at which the IDT electrodes are adjacent to each other. The narrow-pitch electrode fingers are portions in which the spacing or the period between the electrode fingers of the IDT electrodes is smaller than the spacing or period between the electrode fingers of the remaining portions of the IDT electrodes in which the narrow-pitch electrode fingers are provided.

Figure 2:
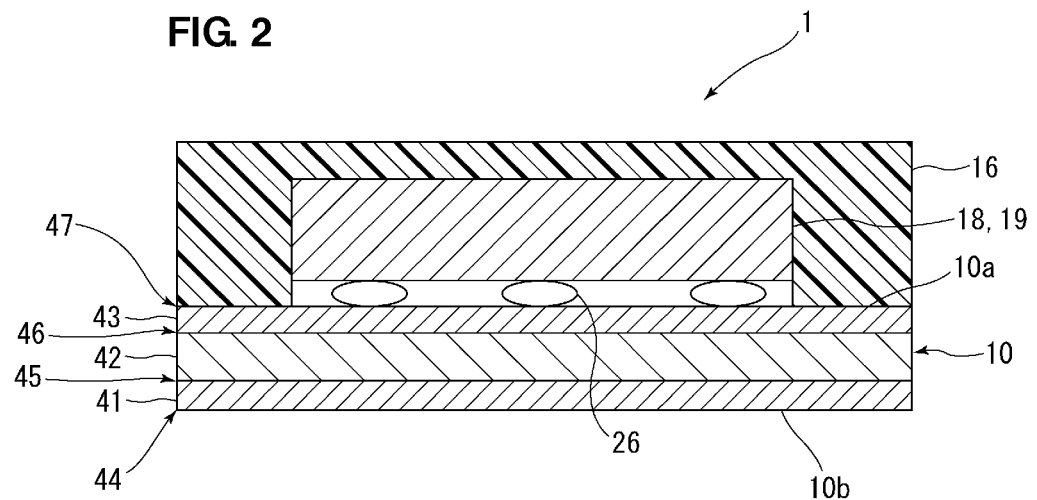
FIG. 2 is a schematic cross-sectional view of the duplexer according to a preferred embodiment of the present invention.

FIG. 2 is a schematic cross-sectional view of the duplexer 1 according to the present preferred embodiment. A specific configuration of the duplexer 1 of the present preferred embodiment will now be described primarily with reference to FIG. 2.

Referring to FIG. 2, the duplexer 1 includes a wiring substrate 10, a transmission-side surface acoustic wave filter chip 18, and a reception-side surface acoustic wave filter chip 19. As shown in FIG. 1, the portion excluding the inductors L2 to L4 of the transmission filter 14 is provided on the transmission-side surface acoustic wave filter chip 18. A terminal 14c is provided on the transmission-side surface acoustic wave filter chip 18. The terminal 14c is connected to the capacitor C1. The transmission-side surface acoustic wave filter chip 18 includes a piezoelectric substrate and electrodes that are provided on the piezoelectric substrate and that include the IDT electrodes and the reflectors of the surface acoustic wave resonators, the pair of interdigital electrodes including the capacitor C1, wirings, and other circuit elements. The reception filter 15 including the longitudinally-coupled-resonator-type surface acoustic wave filter unit 15A is provided on the reception-side surface acoustic wave filter chip 19. The reception-side surface acoustic wave filter chip 19 includes a piezoelectric substrate and electrodes that are provided on the piezoelectric substrate and that include the IDT electrodes and the reflectors of the longitudinally-coupled-resonator-type surface acoustic wave filter unit 15A, wirings, and other circuit elements.

The piezoelectric substrate used in the transmission-side surface acoustic wave filter chip 18 and the reception-side surface acoustic wave filter chip 19 of the duplexer 1 is preferably, for example, a piezoelectric single crystal substrate, such as a $LiNbO_3$ substrate or a $LiTaO_3$ substrate. The electrodes on the transmission-side surface acoustic wave filter chip 18 and the reception-side surface acoustic wave filter chip 19 may preferably be made of, for example, a metal, such as aluminum or an alloy. The electrodes may preferably include, for example, a multilayer body in which a plurality of metal layers are stacked.

As shown in FIG. 2, the wiring substrate 10 includes a die-attach surface 10a and a rear surface 10b. As shown in FIG. 2, the transmission-side surface acoustic wave filter chip 18 and the reception-side surface acoustic wave filter chip 19 are flip-flop mounted on the die-attach surface 10a via bumps 26. A sealing resin layer 16 is provided on the die-attach surface 10a such that the transmission-side surface acoustic wave filter chip 18 and the reception-side surface acoustic wave filter chip 19 are covered with the sealing resin layer 16.

In other words, the duplexer 1 of the present preferred embodiment preferably is a CSP surface acoustic wave filter apparatus.

As shown in FIG. 2, the wiring substrate 10 includes a multilayer body including first to third dielectric layers 41 to and first to fourth electrode layers 44 to 47. The first electrode layer 44 is arranged below the first dielectric layer 41. The second electrode layer 45 is arranged between the first dielectric layer 41 and the second dielectric layer 42. The third electrode layer 46 is arranged between the second dielectric layer 42 and the third dielectric layer 43. The fourth electrode layer 47 is arranged on the third dielectric layer 43. The first to third dielectric layers 41 to 43 each include a plurality of via-hole electrodes provided therein. The wiring substrate 10 is a multilayer substrate in which the electrode layers and the dielectric layers are alternately stacked. The first to third dielectric layers 41 to 43 may each preferably be made of, for example, resin or ceramic, such as alumina. In other words, the wiring substrate 10 may be a multilayer printed wiring substrate made of resin or a ceramic multilayer substrate.

The example in which the wiring substrate includes the multilayer body including the three dielectric layers and the four electrode layers is described in the present preferred embodiment. However, preferred embodiments of the present invention are not limited to this configuration. The wiring substrate may alternatively include four or more dielectric layers, for example.

Figure 3:
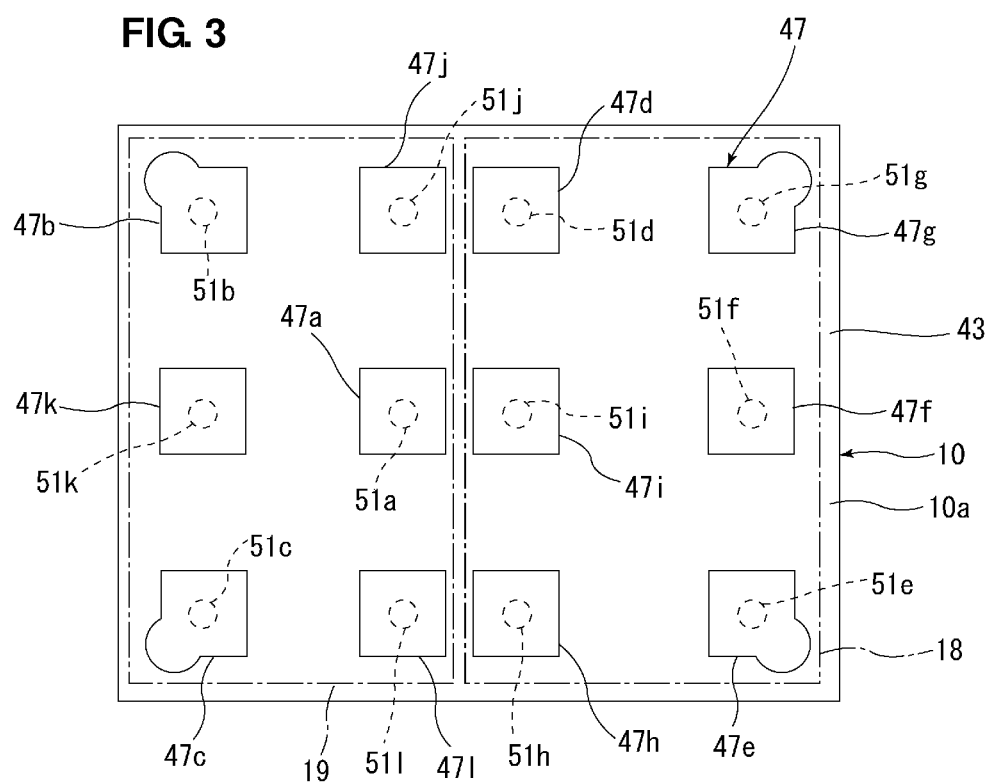
FIG. 3 is a schematic perspective plan view of a fourth electrode layer and a third dielectric layer of a wiring substrate in the duplexer according to a preferred embodiment of the present invention.
Figure 4:
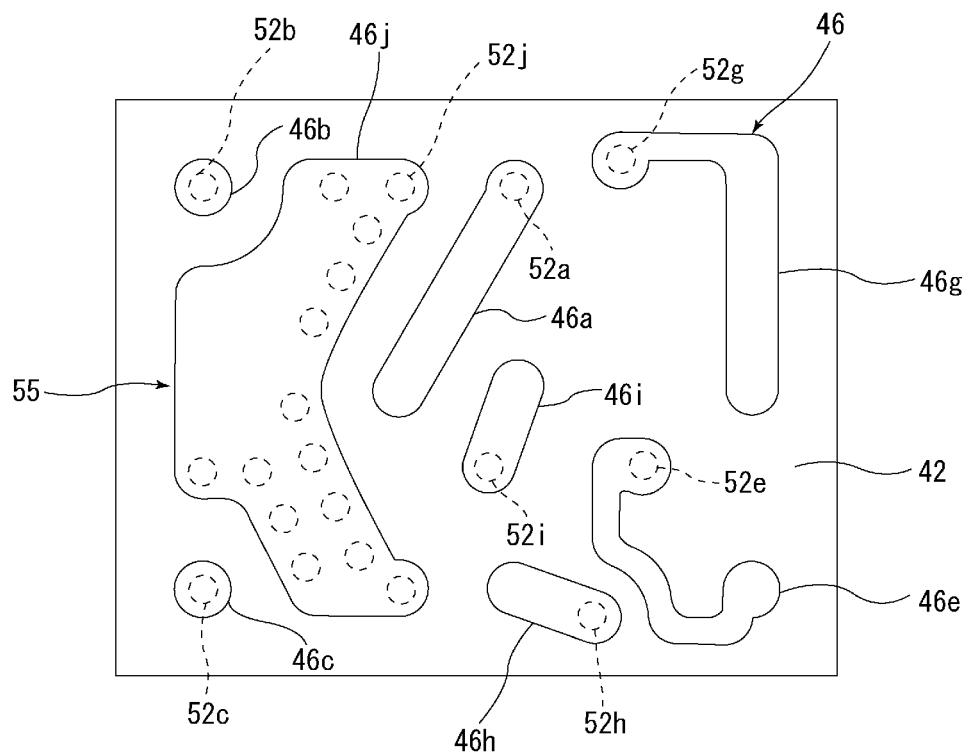
FIG. 4 is a schematic perspective plan view of a third electrode layer and a second dielectric layer of the wiring substrate in the duplexer according to a preferred embodiment of the present invention.
Figure 5:
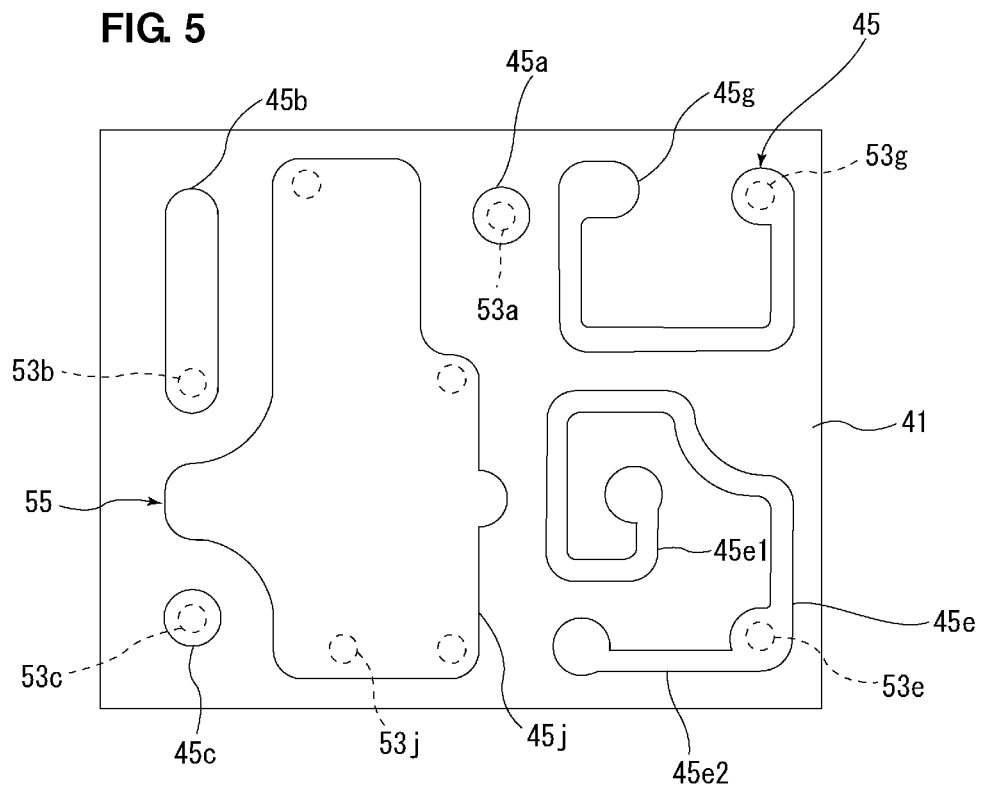
FIG. 5 is a schematic perspective plan view of a second electrode layer and a first dielectric layer of the wiring substrate in the duplexer according to a preferred embodiment of the present invention.
Figure 6:
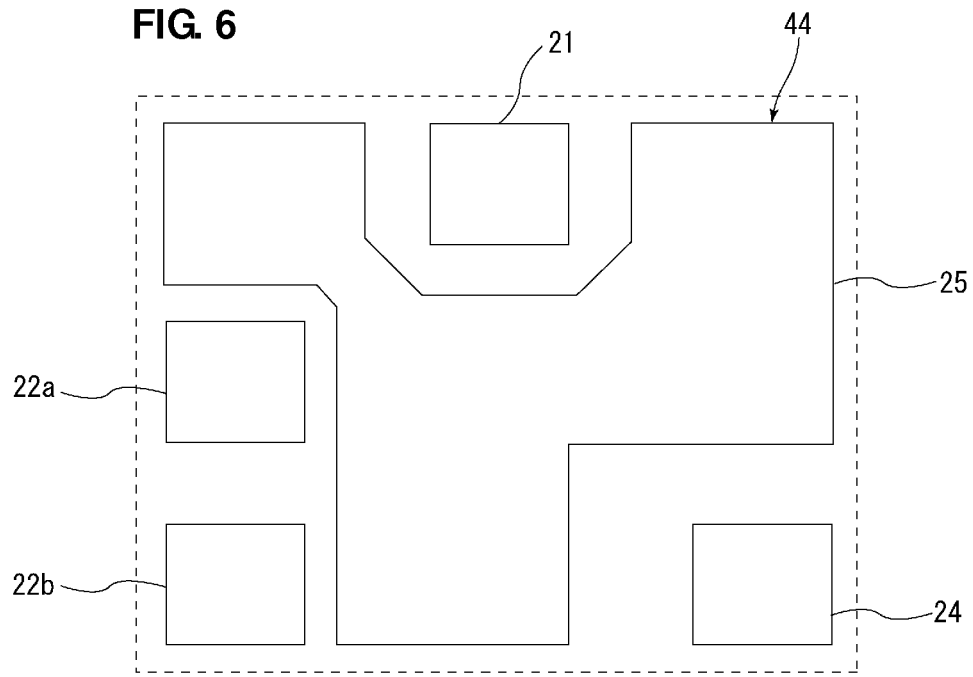
FIG. 6 is a schematic perspective plan view of a first electrode layer of the wiring substrate in the duplexer according to a preferred embodiment of the present invention.

FIG. 3 is a schematic perspective plan view of the fourth electrode layer 47 and the third dielectric layer 43 of the wiring substrate 10 in the duplexer 1 according to the present preferred embodiment. FIG. 4 is a schematic perspective plan view of the third electrode layer 46 and the second dielectric layer 42 of the wiring substrate 10 in the duplexer 1 according to the present preferred embodiment. FIG. 5 is a schematic perspective plan view of the second electrode layer 45 and the first dielectric layer 41 of the wiring substrate 10 in the duplexer 1 according to the present preferred embodiment. FIG. 6 is a schematic perspective plan view of the first electrode layer 44 of the wiring substrate 10 in the duplexer 1 according to the present preferred embodiment. FIGS. 3 to 6 show a state in which the duplexer 1 is seen through from the side of the transmission-side surface acoustic wave filter chip 18 and the reception-side surface acoustic wave filter chip 19.

As shown in FIG. 3, the fourth electrode layer 47 includes land electrodes 47a to 47l. The fourth electrode layer 47 is a land electrode layer. The land electrodes 47a to 47l are provided on the die-attach surface 10a of the wiring substrate 10 and are connected to the transmission-side surface acoustic wave filter chip 18 and the reception-side surface acoustic wave filter chip 19.

As shown in FIG. 4, the third electrode layer 46 includes electrodes 46a to 46c, 46e, and 46g to 46j. The third electrode layer 46 is an intermediate electrode layer. The electrodes 46a to 46c, 46e, and 46g to 46j are wiring electrodes that connect the land electrodes 47a to 47l to any of the antenna terminal 21, the first and second reception terminals 22a and 22b, the transmission terminal 24, and a ground terminal 25.

As shown in FIG. 5, the second electrode layer 45 includes electrodes 45a to 45c, 45e, 45g, and 45j. The second electrode layer 45 is an intermediate electrode layer. The electrodes 45a to 45c, 45e, 45g, and 45j are wiring electrodes that connect the land electrodes 47a to 47l to any of the antenna terminal 21, the first and second reception terminals 22a and 22b, the transmission terminal 24, and the ground terminal 25.

As shown in FIG. 6, the first electrode layer 44 includes the antenna terminal 21, the first and second reception terminals 22a and 22b, the transmission terminal 24, and the ground terminal 25. The first electrode layer 44 is a rear-surface terminal layer. The antenna terminal 21, the first and second reception terminals 22a and 22b, the transmission terminal 24, and the ground terminal 25 are provided on the rear surface 10b of the wiring substrate 10.

The antenna terminal 21 on the first electrode layer 44 is connected to the electrode 45a on the second electrode layer 45 through a via-hole electrode 53a in the first dielectric layer 41. The electrode 45a on the second electrode layer 45 is connected to the electrode 46a on the third electrode layer 46 through a via-hole electrode 52a in the second dielectric layer 42. The electrode 46a on the third electrode layer 46 is connected to the land electrodes 47a and 47d on the fourth electrode layer 47 via via-hole electrodes 51a and 51d in the third dielectric layer 43. The land electrode 47a on the fourth electrode layer 47 is connected to the unbalanced signal terminal 15a of the reception-side surface acoustic wave filter chip 19. The land electrode 47d on the fourth electrode layer 47 is connected to the output terminal 14a of the transmission-side surface acoustic wave filter chip 18.

The first reception terminal 22a on the first electrode layer 44 is connected to the electrode 45b on the second electrode layer 45 through a via-hole electrode 53b in the first dielectric layer 41. The electrode 45b on the second electrode layer 45 is connected to the electrode 46b on the third electrode layer 46 through a via-hole electrode 52b in the second dielectric layer 42. The electrode 46b on the third electrode layer 46 is connected to the land electrode 47b on the fourth electrode layer 47 through a via-hole electrode 51b in the third dielectric layer 43. The land electrode 47b on the fourth electrode layer 47 is connected to the first balanced signal terminal 15b of the reception-side surface acoustic wave filter chip 19.

The second reception terminal 22b on the first electrode layer 44 is connected to the electrode 45c on the second electrode layer 45 through a via-hole electrode 53c in the first dielectric layer 41. The electrode 45c on the second electrode layer 45 is connected to the electrode 46c on the third electrode layer 46 through a via-hole electrode 52c in the second dielectric layer 42. The electrode 46c on the third electrode layer 46 is connected to the land electrode 47c on the fourth electrode layer 47 through a via-hole electrode 51c in the third dielectric layer 43. The land electrode 47c on the fourth electrode layer 47 is connected to the second balanced signal terminal 15c of the reception-side surface acoustic wave filter chip 19.

The transmission terminal 24 on the first electrode layer 44 is connected to the electrode 45e on the second electrode layer 45 through a via-hole electrode 53e in the first dielectric layer 41. The electrode 45e on the second electrode layer 45 includes electrode portions 45e1 and 45e2. The electrode portion 45e1 extends from one end of the electrode 45e on the second electrode layer 45 to the connection point with the via-hole electrode 53e in the first dielectric layer 41. The electrode portion 45e2 extends from the other end of the electrode 45e on the second electrode layer 45 to the connection point with the via-hole electrode 53e in the first dielectric layer 41. The electrode portion 45e1 defines the inductor L4. The electrode 45e on the second electrode layer 45 is connected to the electrodes 46e and 46h on the third electrode layer 46 via via-hole electrodes 52e and 52h in the second dielectric layer 42. The electrode 46e on the third electrode layer 46 defines the inductor L4. The electrode 46e on the third electrode layer 46 is connected to the land electrode 47e on the fourth electrode layer 47 through a via-hole electrode 51e in the third dielectric layer 43. The land electrode 47e on the fourth electrode layer 47 is connected to the input terminal 14b of the transmission-side surface acoustic wave filter chip 18. The electrode 46h on the third electrode layer 46 is connected to the land electrode 47h on the fourth electrode layer 47 through a via-hole electrode 51h in the third dielectric layer 43. The land electrode 47h on the fourth electrode layer 47 is connected to the terminal 14c of the transmission-side surface acoustic wave filter chip 18.

The ground terminal 25 on the first electrode layer 44 is connected to the electrode 45g on the second electrode layer 45 through a via-hole electrode 53g in the first dielectric layer 41. The electrode 45g on the second electrode layer 45 defines the inductor L2. The electrode 45g on the second electrode layer 45 is connected to the electrode 46g on the third electrode layer through a via-hole electrode 52g in the second dielectric layer 42. The electrode 46g on the third electrode layer 46 defines the inductor L2. The electrode 46g on the third electrode layer 46 is connected to the land electrode 47f and 47g on the fourth electrode layer 47 via via-hole electrodes 51f and 51g in the third dielectric layer 43. The land electrode 47f on the fourth electrode layer 47 is connected to the parallel arm resonator P2 of the transmission-side surface acoustic wave filter chip 18. The land electrode 47g on the fourth electrode layer 47 is connected to the parallel arm resonator P1 of the transmission-side surface acoustic wave filter chip 18.

In addition, the ground terminal 25 on the first electrode layer 44 is connected to the electrode 45j on the second electrode layer 45 via multiple via-hole electrodes 53j in the first dielectric layer 41. The electrode 45j on the second electrode layer 45 is connected to the electrodes 46i and 46j on the third electrode layer 46 via multiple via-hole electrodes 52i and 52j in the second dielectric layer 42. The electrode 46i on the third electrode layer 46 defines the inductor L3. The electrode 46i on the third electrode layer 46 is connected to the land electrode 47i on the fourth electrode layer 47 through a via-hole electrode 51i in the third dielectric layer 43. The land electrode 47i on the fourth electrode layer 47 is connected to the parallel arm resonator P3 of the transmission-side surface acoustic wave filter chip 18. The electrode 46j on the third electrode layer 46 is connected to the land electrodes 47j, 47k, and 47l on the fourth electrode layer 47 via via-hole electrode 51j, 51k, and 51l in the third dielectric layer 43. The land electrodes 47j, 47k, and 47l on the fourth electrode layer 47 are connected to the first to fourth longitudinally-coupled-resonator-type surface acoustic wave filter portion 15A1 to 15A4 and the surface acoustic wave resonators 17d and 17e of the reception-side surface acoustic wave filter chip 19.

In the wiring substrate 10, the ground terminal 25 is a ground electrode that connects the transmission filter 14 and the reception filter 15 to the ground. The land electrodes 47j, 47k, and 47l, the via-hole electrodes 51j, 51k, and 51l, the electrode 46j, the multiple via-hole electrodes 52j, the electrode 45j, and the multiple via-hole electrodes 53j are ground electrodes that connect the reception filter 15 to the ground. Accordingly, the land electrodes 47j, 47k, and 47l are ground land electrodes. The electrode 46j and the electrode 45j are ground wiring electrodes 55 that connect the ground terminal 25 to the land electrodes 47j, 47k, and 47l. The multiple via-hole electrodes 52j are first ground via-hole electrodes that connect the electrode 46j, which is a ground wiring electrode 55, to the electrode 45j, which is a ground wiring electrode 55. The via-hole electrodes 51j, 51k, and 51l are second ground via-hole electrodes that connect the electrode 46j, which is the ground wiring electrode 55, to the land electrodes 47j, 47k, and 47l, which are the ground land electrodes. The plurality of via-hole electrodes 53j are third ground via-hole electrodes that connect the electrode 45*j*, which is the ground wiring electrode 55, to the ground terminal 25.

In the wiring substrate 10 in the present preferred embodiment, the number of the via-hole electrodes 52*j*, which are the first ground via-hole electrodes, is preferably greater than that of the via-hole electrodes 51*j*, 51*k*, and 51*l*, which are the second ground via-hole electrodes, and that of the via-hole electrodes 53*j*, which are the third ground via-hole electrodes. Specifically, for example, the number of the via-hole electrodes 52*j* is preferably fourteen, the total number of the via-hole electrodes 51*j*, 51*k*, and 51*l* is preferably three, and the number of the via-hole electrodes 53*j* is preferably four in the present preferred embodiment. Accordingly, it is possible to improve the isolation characteristics of the duplexer 1.

For example, if the number of the via-hole electrodes 53*j*, which are the third ground via-hole electrodes, is increased and the numbers of the via-hole electrodes 52*j* and the via-hole electrodes 51*j*, 51*k*, and 51*l*, which are the first and second ground via-hole electrodes, respectively, are decreased, the grounding becomes poor near the reception-side surface acoustic wave filter chip 19. Accordingly, signals outside the pass band that should flow into the ground are likely not to flow into the ground in the reception-side surface acoustic wave filter chip 19. Consequently, the isolation characteristics are degraded.

Alternatively, for example, the number of the via-hole electrodes 51*j*, 51*k*, and 51*l*, which are the second ground via-hole electrodes, may be increased and the numbers of the via-hole electrodes 52*j* and 53*j*, which are the first and third ground via-hole electrodes, respectively, may be decreased. In this case, the grounding is strengthened near the reception-side surface acoustic wave filter chip 19. However, the capacitive coupling between the electrodes provided on the piezoelectric substrate of the reception-side surface acoustic wave filter chip 19 and the fourth electrode layer 47 of the wiring substrate 10 is increased in such a configuration, thus degrading the isolation characteristics. The same applies to a case in which the number of at least one of the via-hole electrodes 52*j* and the via-hole electrodes 53*j*, which are the first and third ground via-hole electrodes, respectively, is increased, in addition to the increase in the number of the via-hole electrodes 51*j*, 51*k*, and 51*l*, which are the second ground via-hole electrodes. If the numbers of all the via-hole electrodes 51*j*, 51*k*, and 51*l*, the via-hole electrodes 52*j*, and the via-hole electrodes 53*j* are increased when the wiring substrate is a printed wiring board made of resin, the time required to form the via-hole electrodes by irradiation of laser beams is increased, which reduces the productivity of the duplexer.

In contrast, when the number of the via-hole electrodes 52*j*, which are the first ground via-hole electrodes, is greater than that of the via-hole electrodes 51*j*, 51*k*, and 51*l*, which are the second ground via-hole electrodes, and that of the via-hole electrodes 53*j*, which are the third ground via-hole electrodes, as in the present preferred embodiment, the capacitive coupling between the electrodes provided on the piezoelectric substrate of the reception-side surface acoustic wave filter chip 19 and the fourth electrode layer 47 of the wiring substrate 10 is decreased, while strengthening the grounding near the reception-side surface acoustic wave filter chip 19. Accordingly, it is possible to improve the isolation characteristics of the duplexer 1.

These advantages will now be described in more detail while referring to specific examples. The same reference numerals are used in an example of a preferred embodiment of the present invention and Comparative examples 1 and 2 described below to identify the components having substantially the same functions as those in the preferred embodiment described above. A description of such components is omitted herein.

The duplexer 1 according to the above-described preferred embodiment was manufactured by using the following parameters as a non-limiting example. The wavelength of surface acoustic waves defined by the spacing or period between the electrode fingers of the IDT electrodes is denoted by $\lambda 1$.

Design Parameters in Example

Piezoelectric substrate of the reception-side surface acoustic wave filter chip 19: X-propagation $LiTaO_3$ substrate that is Y-cut at 40°±5°

Electrodes of the reception-side surface acoustic wave filter chip 19: Al, Ti

First longitudinally-coupled-resonator-type surface acoustic wave filter portion 15A1:

Intersecting width of the IDT electrodes: about 30.4 $\lambda 1$

The number of the electrode fingers of the IDT electrodes on both sides: 39 (including the number of the narrow-pitch electrode fingers: five)

The number of the electrode fingers of the central IDT electrode: 43 (including the number of the narrow-pitch electrode fingers at one end: three, the number of the narrow-pitch electrode fingers at the other end: seven)

The number of the electrode fingers of the reflectors: 65

Metallization ratio of the IDT electrodes and the reflectors: about 0.68

Electrode film thickness of the IDT electrodes and the reflectors: about 0.091 $\lambda 1$ Among the IDT electrodes on both sides, the spacing or period between the narrow-pitch electrode fingers of the IDT electrodes at one side was designed so as to be smaller than the spacing or period between the narrow-pitch electrode fingers of the IDT electrodes at the other side by about 0.09 μm.

Second longitudinally-coupled-resonator-type surface acoustic wave filter portion 15A2: The same design parameters as those of the first longitudinally-coupled-resonator-type surface acoustic wave filter portion 15A1

Third and fourth longitudinally-coupled-resonator-type surface acoustic wave filter portions 15A3 and 15A4: differ from the first and second longitudinally-coupled-resonator-type surface acoustic wave filter portions 15A1 and 15A2 only in that the IDT electrodes on both sides are inverted Surface acoustic wave resonators 17*a* to 17*c*:

Intersecting width of the IDT electrodes: about 11.0 $\lambda 1$

The number of the electrode fingers of the IDT electrodes: 71

The number of the electrode fingers of the reflectors: 18

Metallization ratio of the IDT electrodes and the reflectors: about 0.60

Electrode film thickness of the IDT electrodes and the reflectors: about 0.095 $\lambda 1$ Surface acoustic wave resonators 17*d* and 17*e*:

Intersecting width of the IDT electrodes: about 30.0 $\lambda 1$

The IDT electrodes were subjected to apodization weighting so as to maximize the intersecting width at the central parts of the IDT electrodes and the above values are for portions where the intersecting width is maximized.

The number of the electrode fingers of the IDT electrodes: 111

The number of the electrode fingers of the reflectors: 18

Metallization ratio of the IDT electrodes and the reflectors: about 0.60

Electrode film thickness of the IDT electrodes and the reflectors: about 0.091 $\lambda 1$ In Comparative Examples 1 and 2, duplexers having the same or substantially the same configuration as that in the example, except for the configuration of the wiring substrate 10 were manufactured.

Figure 7:
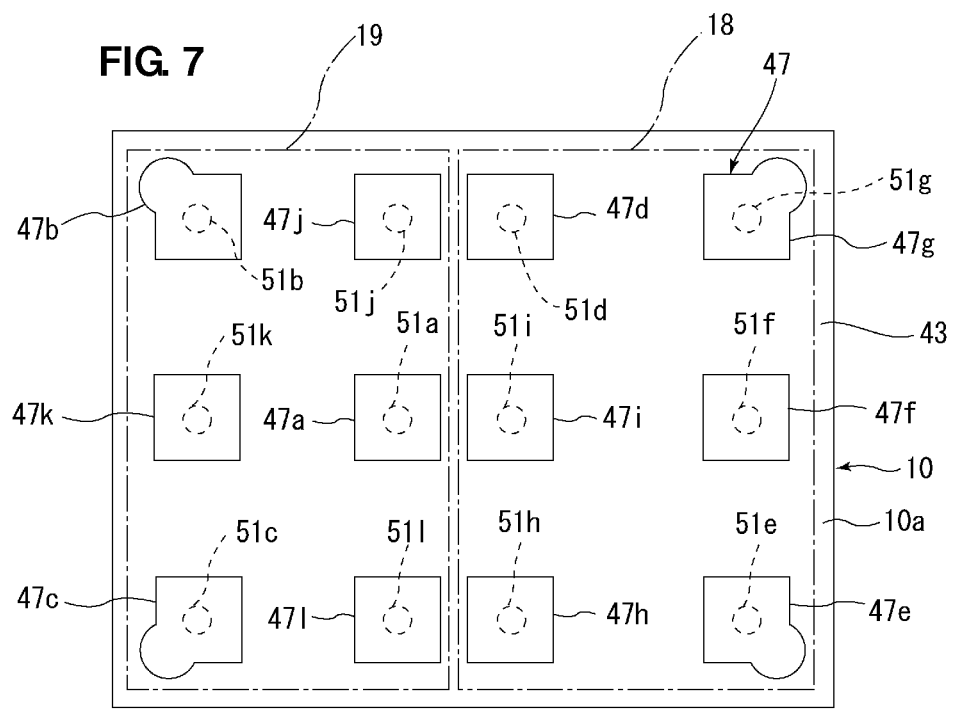
FIG. 7 is a schematic perspective plan view of a fourth electrode layer and a third dielectric layer of a wiring substrate in a duplexer of a Comparative Example 1.
Figure 8:
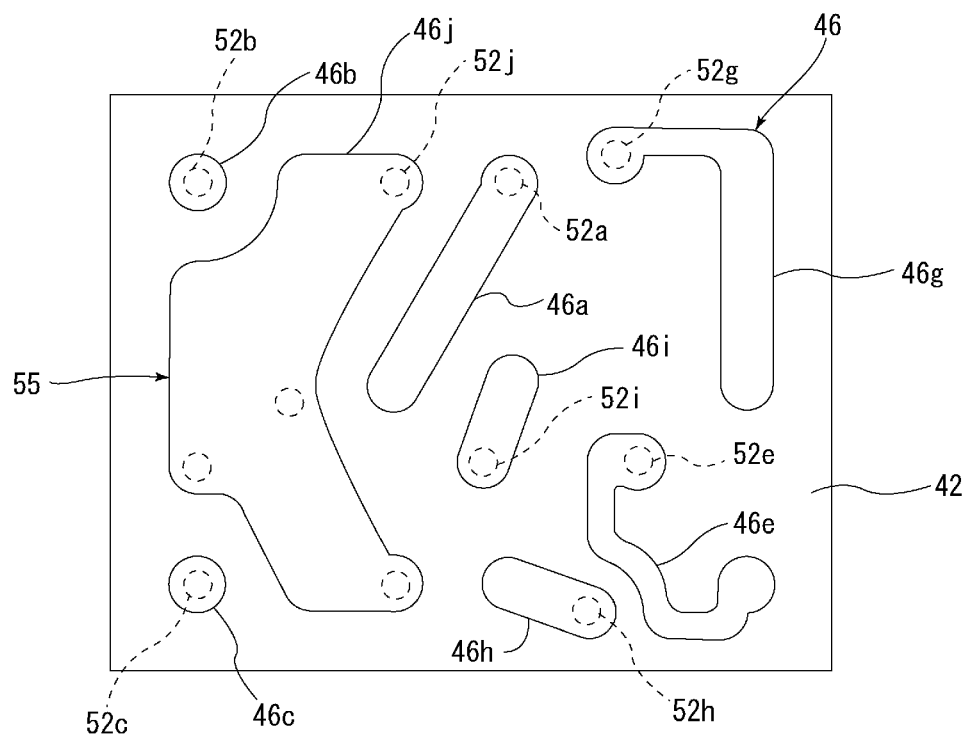
FIG. 8 is a schematic perspective plan view of a third electrode layer and a second dielectric layer of the wiring substrate in the duplexer of the Comparative Example 1.
Figure 9:
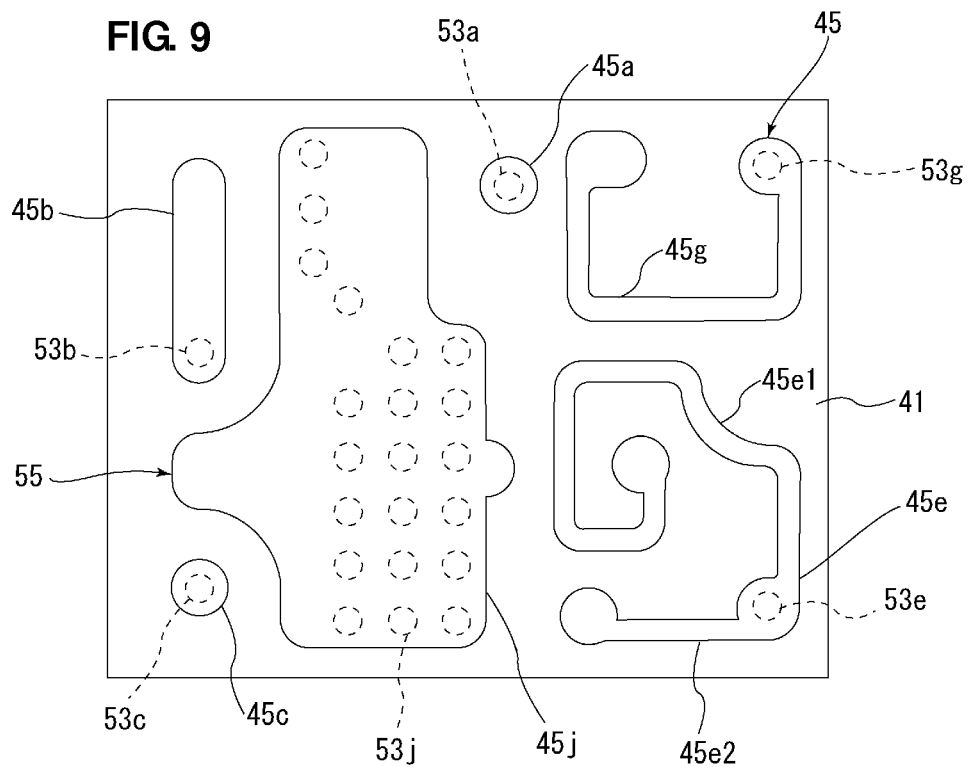
FIG. 9 is a schematic perspective plan view of a second electrode layer and a first dielectric layer of the wiring substrate in the duplexer of the Comparative Example 1.
Figure 10:
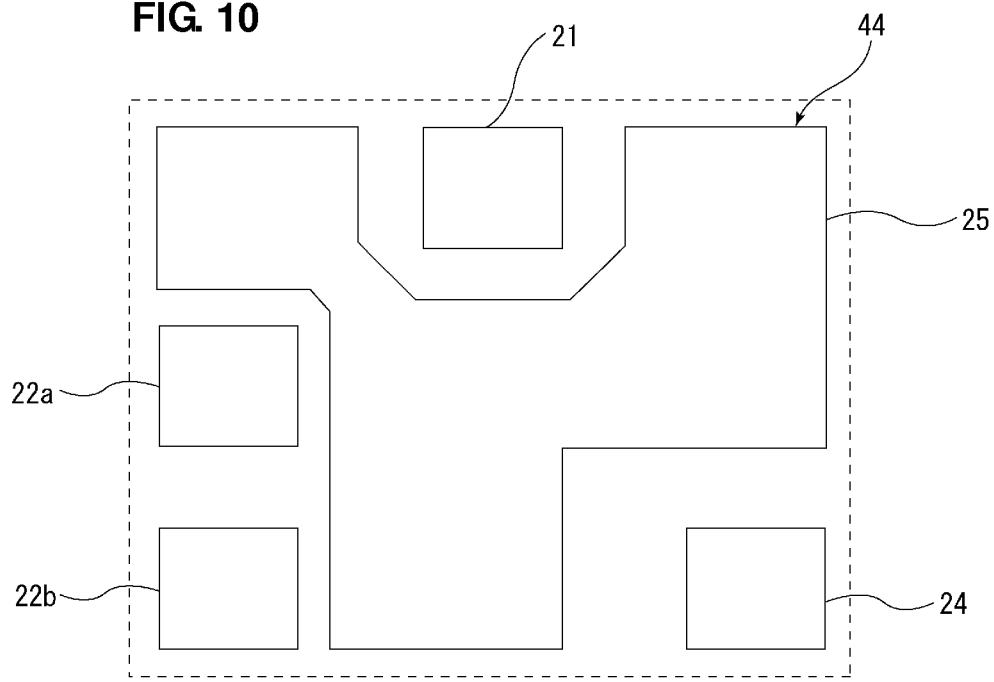
FIG. 10 is a schematic perspective plan view of a first electrode layer of the wiring substrate in the duplexer of the Comparative Example 1.

FIG. 7 is a schematic perspective plan view of the fourth electrode layer 47 and the third dielectric layer 43 of the wiring substrate 10 in the duplexer of Comparative Example 1. FIG. 8 is a schematic perspective plan view of the third electrode layer 46 and the second dielectric layer 42 of the wiring substrate 10 in the duplexer of Comparative Example 1. FIG. 9 is a schematic perspective plan view of the second electrode layer 45 and the first dielectric layer 41 of the wiring substrate 10 in the duplexer of Comparative Example 1. FIG. 10 is a schematic perspective plan view of the first electrode layer 44 of the wiring substrate 10 in the duplexer of Comparative Example 1. FIG. 7 to FIG. 10 show a state in which the duplexer of Comparative Example 1 is seen through from the side of the transmission-side surface acoustic wave filter chip 18 and the reception-side surface acoustic wave filter chip 19.

As shown in FIG. 7 to FIG. 10, the number of the via-hole electrodes 52$j$ is four, the total number of the via-hole electrodes 51$j$, 51$k$, and 51$l$ is three, and the number of the via-hole electrodes 53$j$ is 21 in the duplexer of Comparative Example 1. Accordingly, the number of the via-hole electrodes 52$j$ is greater than that of the via-hole electrodes 51$j$, 51$k$, and 51$l$ but is less than that of the via-hole electrodes 53$j$ in the duplexer of Comparative Example 1.

Figure 11:
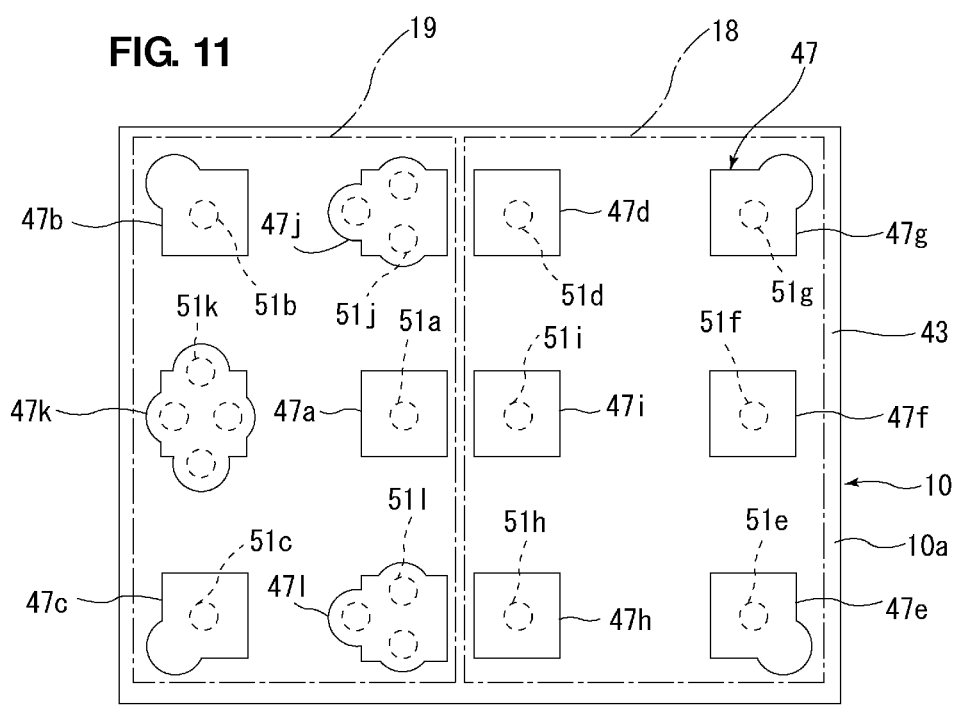
FIG. 11 is a schematic perspective plan view of a fourth electrode layer and a third dielectric layer of a wiring substrate in a duplexer of a Comparative Example 2.
Figure 12:
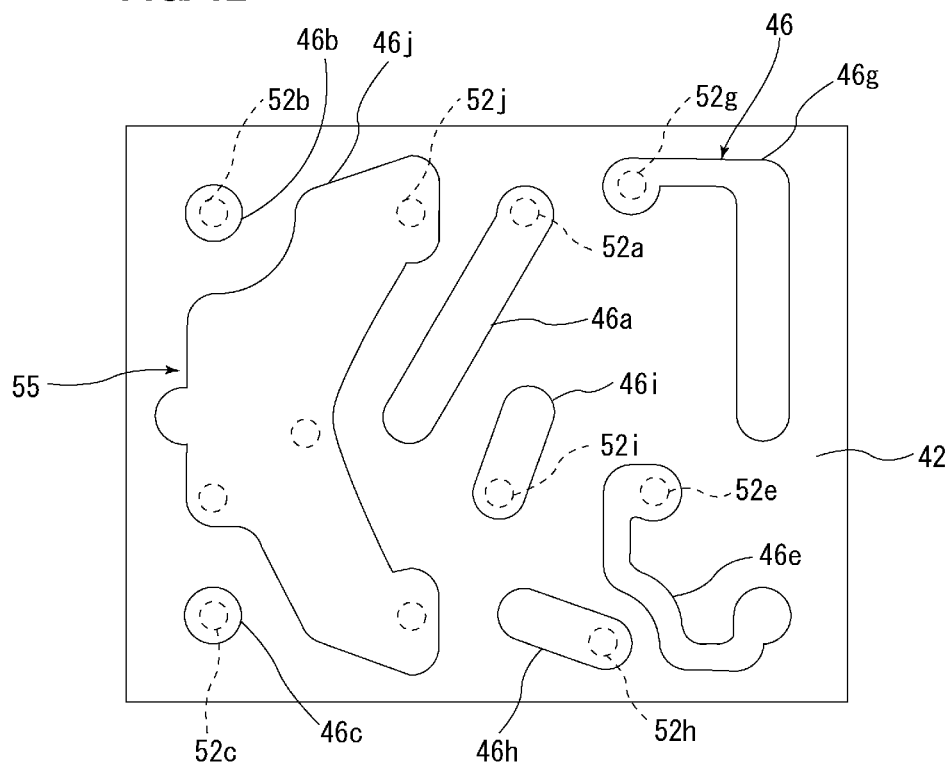
FIG. 12 is a schematic perspective plan view of a third electrode layer and a second dielectric layer of the wiring substrate in the duplexer of the Comparative Example 2.
Figure 13:
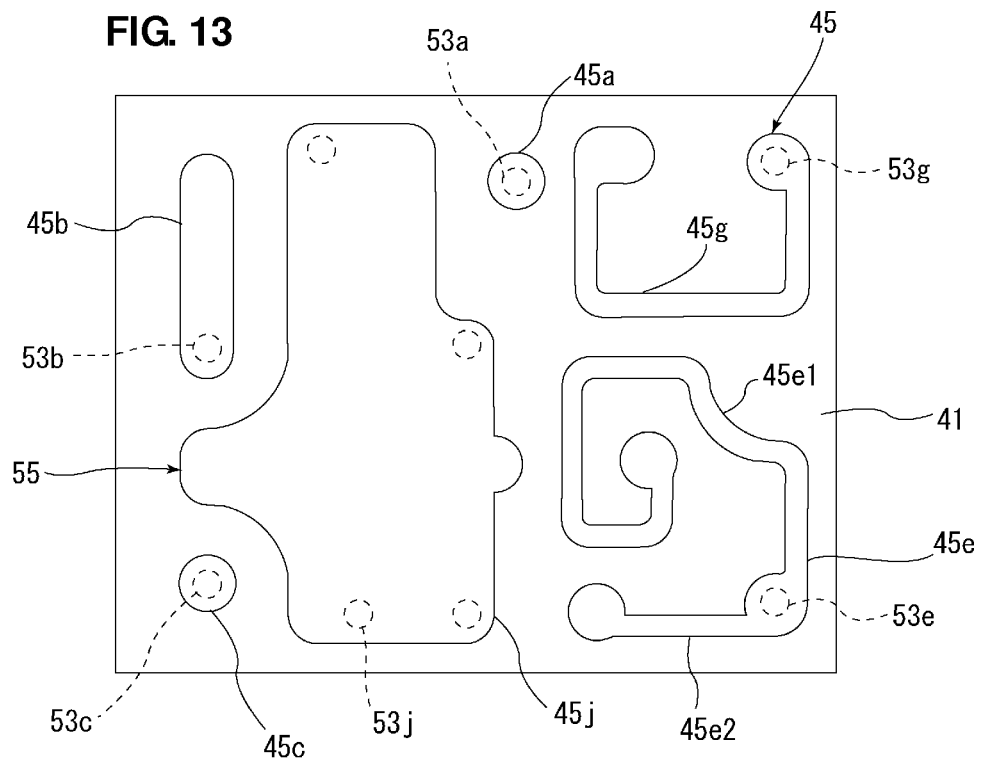
FIG. 13 is a schematic perspective plan view of a second electrode layer and a first dielectric layer of the wiring substrate in the duplexer of the Comparative Example 2.
Figure 14:
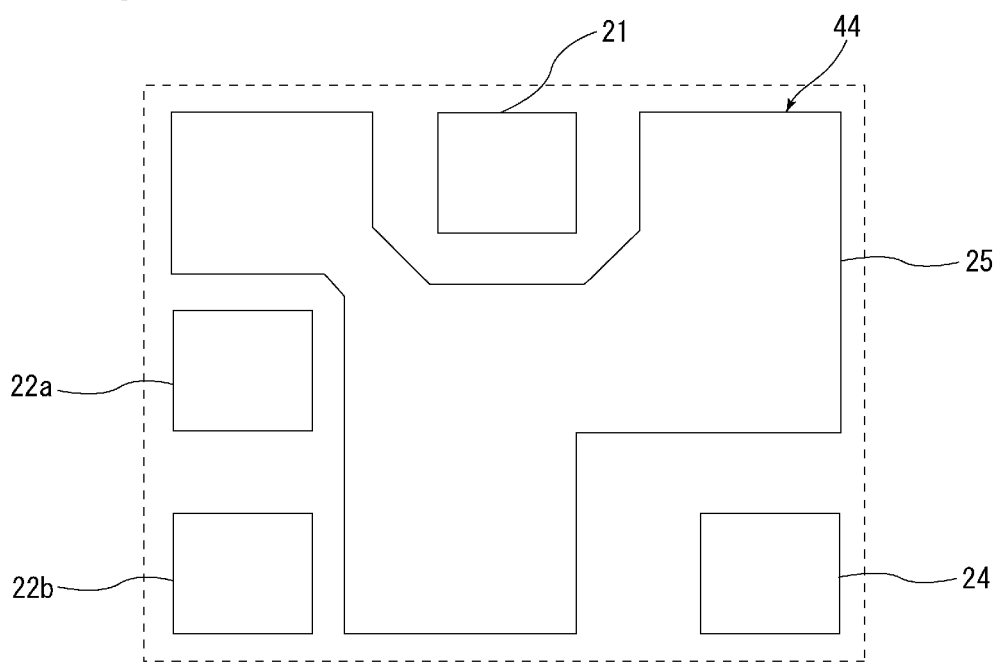
FIG. 14 is a schematic perspective plan view of a first electrode layer of the wiring substrate in the duplexer of Comparative example 2.

FIG. 11 is a schematic perspective plan view of the fourth electrode layer 47 and the third dielectric layer 43 of the wiring substrate 10 in the duplexer of Comparative Example 2. FIG. 12 is a schematic perspective plan view of the third electrode layer 46 and the second dielectric layer 42 of the wiring substrate 10 in the duplexer of Comparative Example 2. FIG. 13 is a schematic perspective plan view of the second electrode layer 45 and the first dielectric layer 41 of the wiring substrate 10 in the duplexer of Comparative Example 2. FIG. 14 is a schematic perspective plan view of the first electrode layer 44 of the wiring substrate 10 in the duplexer of Comparative Example 2. FIG. 11 to FIG. 14 show a state in which the duplexer of Comparative Example 2 is seen through from the side of the transmission-side surface acoustic wave filter chip 18 and the reception-side surface acoustic wave filter chip 19.

As shown in FIG. 11 to FIG. 14, the number of the via-hole electrodes 52$j$ is four, the total number of the via-hole electrodes 51$j$, 51$k$, and 51$l$ is ten, and the number of the via-hole electrodes 53$j$ is four in the duplexer of Comparative Example 2. Accordingly, the number of the via-hole electrodes 52$j$ is equal to that of the via-hole electrodes 53$j$ but is less than that of the via-hole electrodes 51$j$, 51$k$, and 51$l$ in the duplexer of Comparative Example 2.

Next, the isolation characteristics of the duplexer 1 of the example of a preferred embodiment of the present invention and the duplexers of the Comparative Examples 1 and 2 were measured. Specifically, "a differential characteristic", "a first unbalance mode", and "a second unbalance mode" were measured as the isolation characteristics. The differential characteristic indicates an isolation characteristic in a differential state between the transmission terminal 24 and the first and second reception terminals 22$a$ and 22$b$. The first unbalance mode indicates an isolation characteristic in an unbalance mode between the transmission terminal 24 and the first reception terminal 22$a$. The second unbalance mode indicates an isolation characteristic in the unbalance mode between the transmission terminal 24 and the second reception terminal 22$b$.

Figure 15:
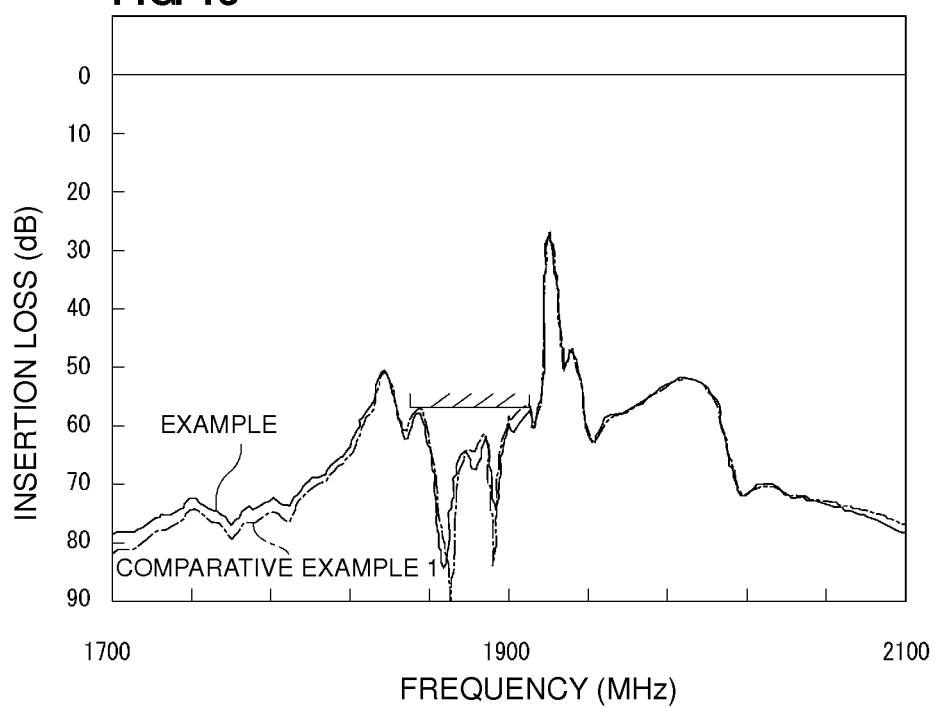
FIG. 15 is a graph showing a differential characteristic of a duplexer of an example of a preferred embodiment of the present invention and the differential characteristic of the duplexer of the Comparative Example 1.
Figure 16:
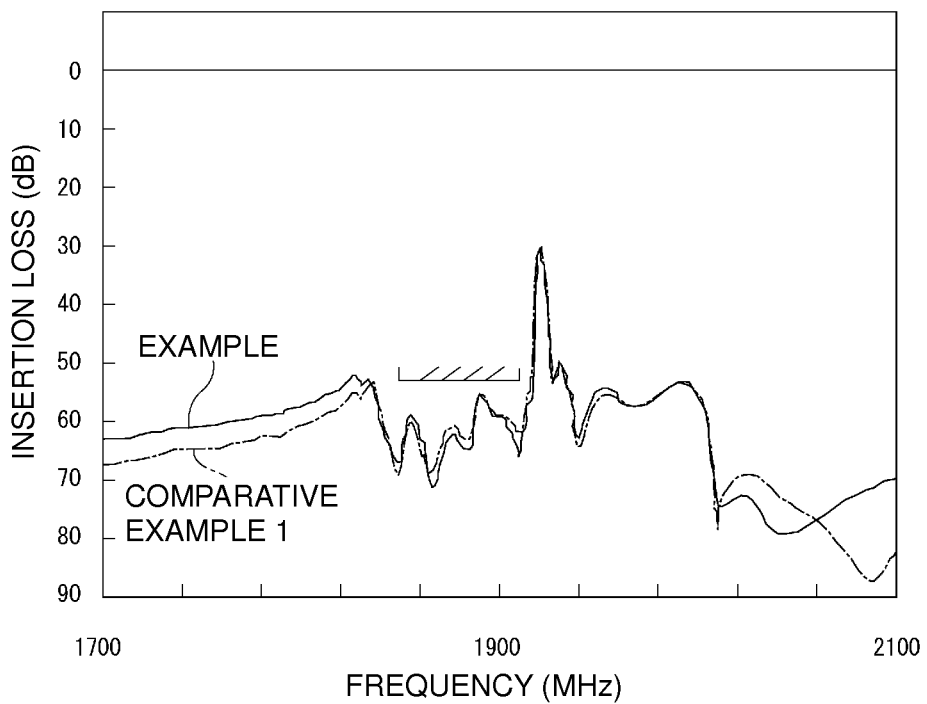
FIG. 16 is a graph showing a first unbalance mode of the duplexer of the example of a preferred embodiment of the present invention and the first unbalance mode of the duplexer of the Comparative Example 1.
Figure 17:
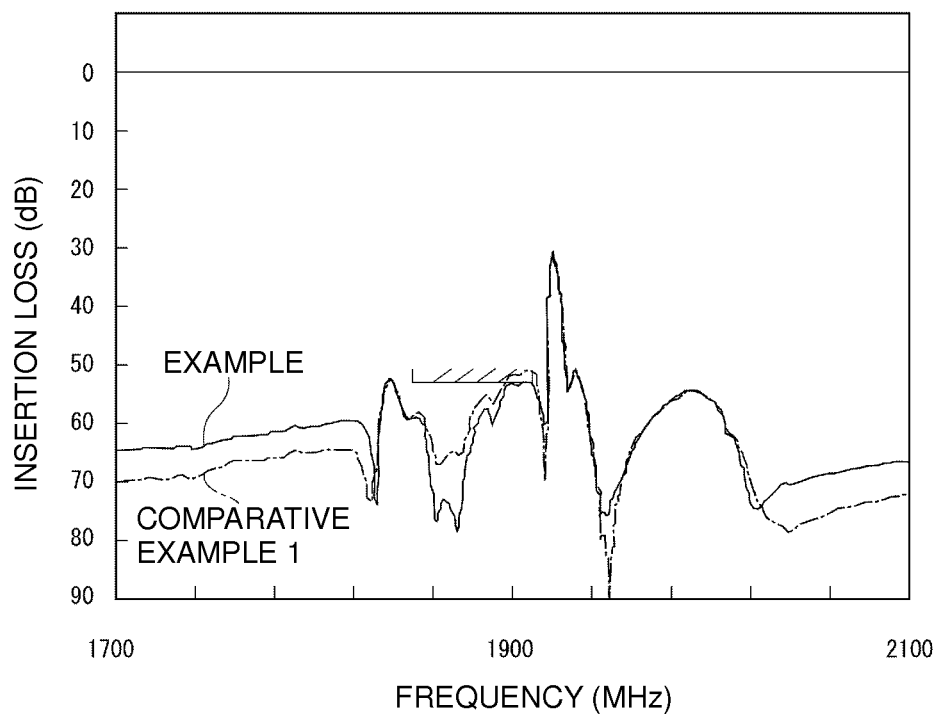
FIG. 17 is a graph showing a second unbalance mode of the duplexer of the example of a preferred embodiment of the present invention and the second unbalance mode of the duplexer of the Comparative Example 1.

FIG. 15 shows the differential characteristic of the duplexer 1 of the example and the differential characteristic of the duplexer of Comparative Example 1. FIG. 16 shows the first unbalance mode of the duplexer 1 of the example and the first unbalance mode of the duplexer of Comparative Example 1. FIG. 17 shows the second unbalance mode of the duplexer 1 of the example and the second unbalance mode of the duplexer of Comparative Example 1.

As shown in FIG. 15, the minimum value of the attenuation in the transmission frequency band (1,850 MHz to 1,910 MHz) in the differential characteristic was equal to about 57.7 dB in the duplexer 1 of the example and was equal to about 56.2 dB in the duplexer of Comparative Example 1. The duplexer 1 of the example is superior to the duplexer of Comparative Example 1 in the differential characteristic by about 1.5 dB.

As shown in FIG. 16, the minimum value of the attenuation in the transmission frequency band (1,850 MHz to 1,910 MHz) in the first unbalance mode was equal to about 56.0 dB in the duplexer 1 of the example and was equal to about 55.0 dB in the duplexer of Comparative Example 1. The duplexer 1 of the example is superior to the duplexer of Comparative example 1 in the first unbalance mode by about 1.0 dB.

As shown in FIG. 17, the minimum value of the attenuation in the transmission frequency band (1,850 MHz to 1,910 MHz) in the second unbalance mode was equal to about 52.7 dB in the duplexer 1 of the example and was equal to about 50.7 dB in the duplexer of Comparative Example 1. The duplexer 1 of the example is superior to the duplexer of Comparative example 1 in the second unbalance mode by about 2.0 dB.

Figure 18:
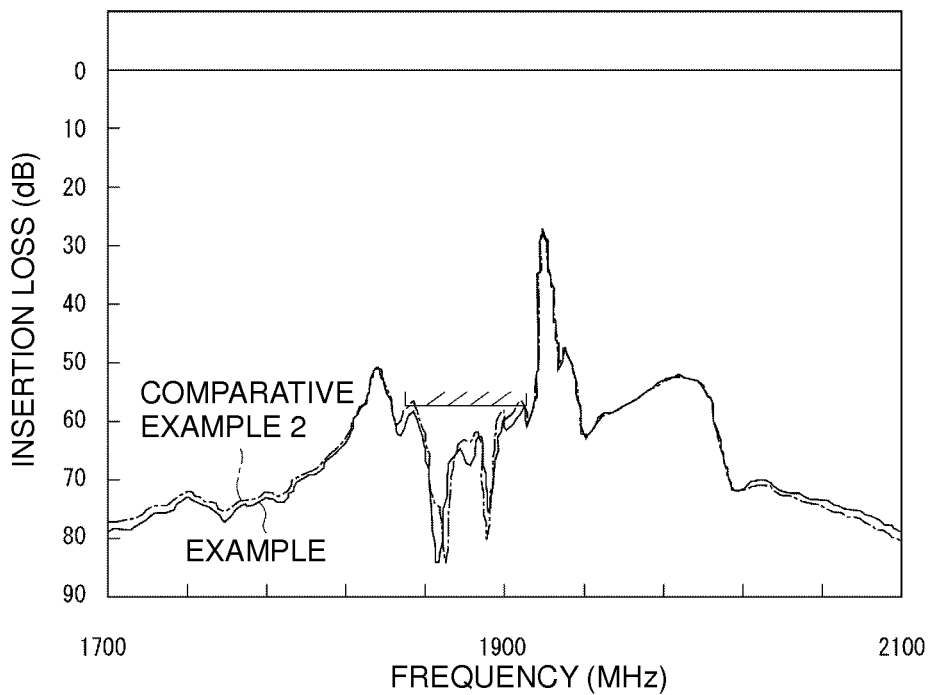
FIG. 18 is a graph showing the differential characteristic of the duplexer of the example of a preferred embodiment of the present invention and the differential characteristic of the duplexer of the Comparative Example 2.
Figure 19:
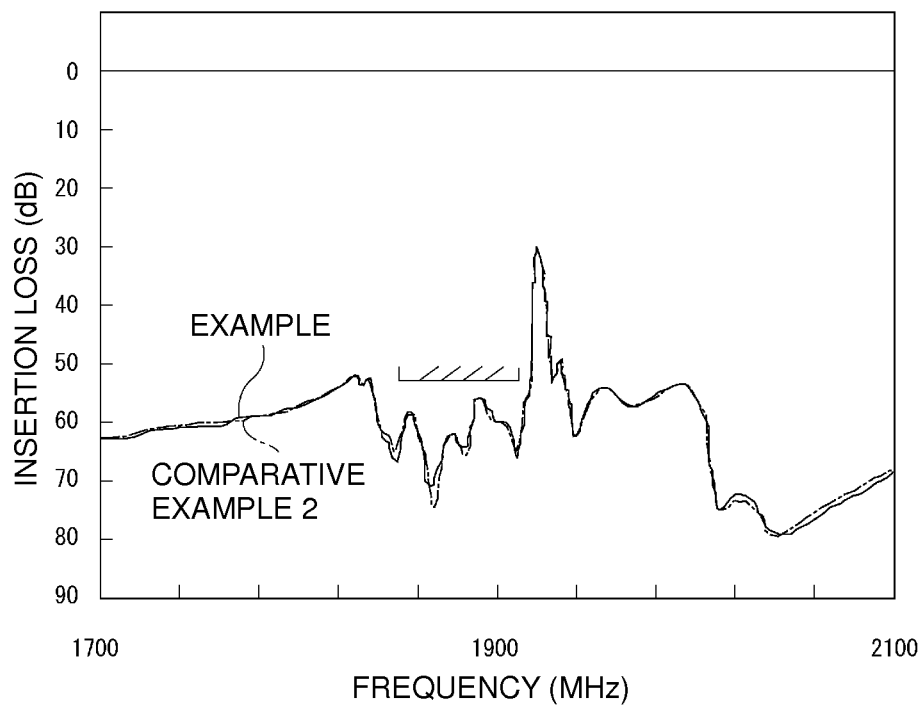
FIG. 19 is a graph showing the first unbalance mode of the duplexer of the example of a preferred embodiment of the present invention and the first unbalance mode of the duplexer of the Comparative Example 2.
Figure 20:
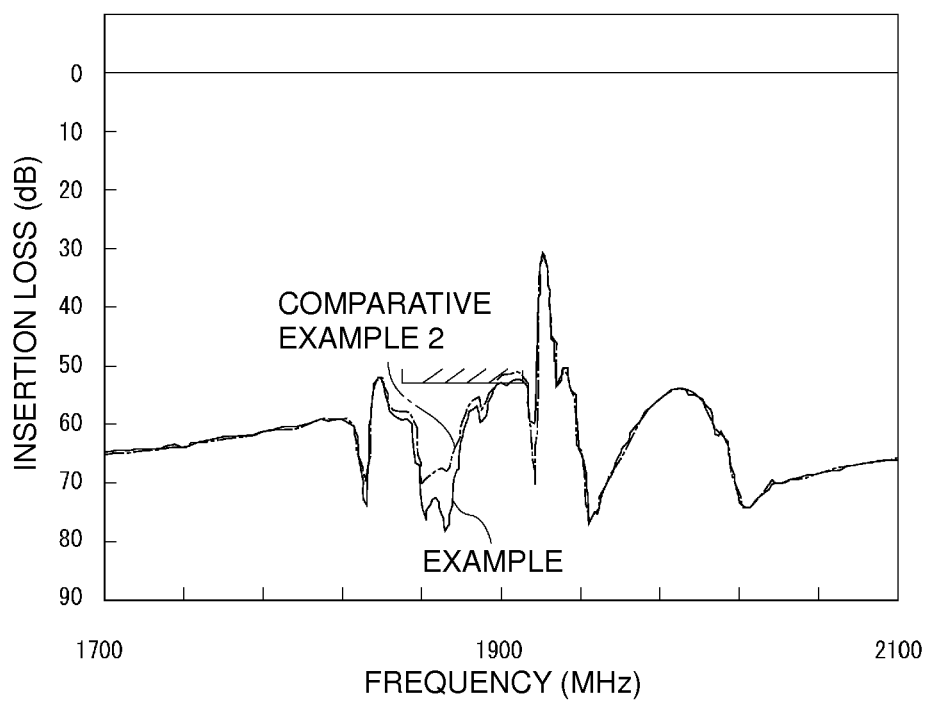
FIG. 20 is a graph showing the second unbalance mode of the duplexer of the example of a preferred embodiment of the present invention and the second unbalance mode of the duplexer of the Comparative Example 2.

FIG. 18 shows the differential characteristic of the duplexer 1 of the example and the differential characteristic of the duplexer of Comparative Example 2. FIG. 19 shows the first unbalance mode of the duplexer 1 of the example and the first unbalance mode of the duplexer of Comparative Example 2. FIG. 20 shows the second unbalance mode of the duplexer 1 of the example and the second unbalance mode of the duplexer of Comparative Example 2.

As shown in FIG. 18, the minimum value of the attenuation in the transmission frequency band (1,850 MHz to 1,910 MHz) in the differential characteristic was equal to about 57.7 dB in the duplexer 1 of the example and was equal to about 56.0 dB in the duplexer of Comparative Example 2. The duplexer 1 of the example is superior to the duplexer of Comparative Example 2 in the differential characteristic by about 1.7 dB.

As shown in FIG. 19, the minimum value of the attenuation in the transmission frequency band (1,850 MHz to 1,910 MHz) in the first unbalance mode was equal to about 56.0 dB in the duplexer 1 of the example and was equal to about 56.0 dB in the duplexer of Comparative Example 2. The duplexer 1 of the example is approximately equivalent to the duplexer of Comparative Example 2 in the first unbalance mode.

As shown in FIG. 20, the minimum value of the attenuation in the transmission frequency band (1,850 MHz to 1,910 MHz) in the second unbalance mode was equal to about 52.7 dB in the duplexer 1 of the example and was equal to about 51.0 dB in the duplexer of Comparative Example 2. The duplexer 1 of the example is superior to the duplexer of Comparative example 2 in the second unbalance mode by about 1.7 dB.

The above measurements show that providing the via-hole electrodes 52$j$, which are the first ground via-hole electrodes, in a number that is greater than the number of the via-hole electrodes 51$j$, 51$k$, and 51$l$, which are the second ground via-hole electrodes, and the number of the via-hole electrodes 53j, which are the third ground via-hole electrodes, allows the isolation characteristics of the duplexer 1 to be improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave demultiplexer comprising:
   an elastic wave filter chip including a longitudinally-coupled-resonator-type elastic wave filter unit that includes a piezoelectric substrate and a plurality of IDT electrodes provided on the piezoelectric substrate; and
   a wiring substrate including a die-attach surface on which the elastic wave filter chip is mounted, a rear surface opposed to the die-attach surface, a land electrode layer including a plurality of land electrodes, a rear-surface terminal layer including a plurality of terminals, a plurality of intermediate electrode layers including a plurality of wiring electrodes, and at least three dielectric layers, the plurality of land electrodes being provided on the die-attach surface and being connected to the elastic wave filter chip, the plurality of terminals being provided on the rear surface, and the plurality of land electrodes being connected to the plurality of terminals via the plurality of wiring electrodes; wherein
   each of the at least three dielectric layers is arranged between two of the land electrode layer, the plurality of intermediate layers, and the rear-surface terminal layer and the at least three dielectric layers include a plurality of via-hole electrodes connected to any of the plurality of land electrodes, the plurality of wiring electrodes, and the plurality of terminals;
   the plurality of terminals include a ground terminal that is grounded;
   the plurality of land electrodes include ground land electrodes connected to the ground terminal;
   the plurality of wiring electrodes include a plurality of ground wiring electrodes via which the ground terminal is connected to the ground land electrodes;
   the plurality of via-hole electrodes include first ground via-hole electrodes via which the ground wiring electrodes are connected to each other, second ground via-hole electrodes via which the ground wiring electrodes are connected to the ground land electrodes, and a third ground via-hole electrode via which the ground wiring electrodes are connected to the ground terminal; and
   a number of the first ground via-hole electrodes is greater than a number of the second ground via-hole electrodes and a number of the third ground via-hole electrodes.

2. The elastic wave demultiplexer according to claim 1, further comprising:
   a transmission filter and a reception filter; wherein
   the reception filter is defined by the longitudinally-coupled-resonator-type elastic wave filter unit.

3. The elastic wave demultiplexer according to claim 2, wherein a sealing resin layer is provided on the die-attach surface so as to cover each of the transmission filter and the reception filter.

4. The elastic wave demultiplexer according to claim 2, wherein both of the transmission filter and the reception filter are flip-flop mounted on the die-attach surface of the wiring substrate via bumps.

5. The elastic wave demultiplexer according to claim 2, wherein both of the transmission filter and the reception filter are mounted on the die-attach surface of the wiring substrate.

6. The elastic wave demultiplexer according to claim 1, wherein the longitudinally-coupled-resonator-type elastic wave filter unit is a balanced longitudinally-coupled-resonator-type elastic wave filter unit having a balanced-to-unbalanced conversion function.

7. The elastic wave demultiplexer according to claim 1, wherein a sealing resin layer is provided on the die-attach surface so as to cover the elastic wave filter chip.

8. The elastic wave demultiplexer according to claim 1, wherein the at least three dielectric layers are made of resin.

9. The elastic wave demultiplexer according to claim 1, wherein the at least three dielectric layers are made of alumina.

10. The elastic wave demultiplexer according to claim 1, wherein
    the at least three dielectric layers include a first dielectric layer, a second dielectric layer, a third dielectric layer;
    the intermediate electrode layers includes a first intermediate electrode layer disposed between the first and second dielectric layers and a second intermediate electrode layer disposed between the second and third dielectric layers.

11. The elastic wave demultiplexer according to claim 10, wherein the plurality of ground wiring electrodes include a first ground electrode disposed between the first and second dielectric layers and a second ground electrode disposed between the second and third dielectric layers.

12. The elastic wave demultiplexer according to claim 1, wherein at least one of the plurality of intermediate electrode layers includes a wiring electrode that defines an inductor.

13. The elastic wave demultiplexer according to claim 1, wherein the number of the first ground via-hole electrodes is fourteen, the number of the second ground via-hole electrodes is three, and the number of the third ground via-hole electrodes is four.

14. The elastic wave demultiplexer according to claim 1, wherein the plurality of IDT electrodes include narrow-pitch electrode finger portions provided at ends of the plurality of IDT electrodes in portions at which the plurality of IDT electrodes are adjacent to each other, the narrow-pitch electrode finger portions having a smaller electrode finger pitch than other portions of the plurality of IDT electrodes.

15. The elastic wave demultiplexer according to claim 1, wherein the longitudinally-coupled-resonator-type elastic wave filter unit includes first, second, third, and fourth longitudinally-coupled-resonator-type surface acoustic wave filter portions arranged along an elastic wave propagation direction.

16. The elastic wave demultiplexer according to claim 15, wherein each of the first, second, third, and fourth longitudinally-coupled-resonator-type surface acoustic wave filter portions includes three IDT electrodes of the plurality of IDT electrodes arranged along the elastic wave propagation direction and a pair of reflectors arranged on both sides of an area in which the first, second, third, and fourth longitudinally-coupled-resonator-type surface acoustic wave filter portions are provided in the elastic wave propagation direction.

* * * * *